United States Patent
Yun et al.

(10) Patent No.: US 7,312,150 B2
(45) Date of Patent: Dec. 25, 2007

(54) METHOD OF FORMING COBALT DISILICIDE LAYER AND METHOD OF MANUFACTURING SEMICONDUCTOR DEVICE USING THE SAME

(75) Inventors: Jong-ho Yun, Gyeonggi-do (KR); Gil-heyun Choi, Gyeonggi-do (KR); Sang-bom Kang, Seoul (KR); Woong-hee Sohn, Gyeonggi-do (KR); Hyun-su Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 331 days.

(21) Appl. No.: 10/936,853

(22) Filed: Sep. 9, 2004

(65) Prior Publication Data

US 2005/0136659 A1    Jun. 23, 2005

(30) Foreign Application Priority Data

Dec. 23, 2003    (KR) .................... 10-2003-0095410

(51) Int. Cl.
H01L 21/44    (2006.01)

(52) U.S. Cl. .............. 438/682; 438/592; 438/197; 438/586; 257/E21.165

(58) Field of Classification Search ............... 438/592, 438/682, 197, 586; 257/E21.165; 360/294.3, 360/294.1, 294, 294.7, 291, 290, 240
See application file for complete search history.

(56) References Cited

U.S. PATENT DOCUMENTS

| | | | | |
|---|---|---|---|---|
| 4,814,294 A | * | 3/1989 | West et al. .................. 438/606 |
| 4,902,379 A | | 2/1990 | Rhodes | |
| 5,605,865 A | * | 2/1997 | Maniar et al. .............. 438/301 |
| 5,899,720 A | * | 5/1999 | Mikagi ....................... 438/303 |
| 6,107,096 A | * | 8/2000 | Mikagi ....................... 438/586 |
| 6,281,117 B1 | * | 8/2001 | Chan et al. ................. 438/649 |

(Continued)

FOREIGN PATENT DOCUMENTS

| | | |
|---|---|---|
| KR | 1997-0023745 | 5/1997 |
| KR | 2005-29341 | 3/2005 |

OTHER PUBLICATIONS

Notice to Submit Response, Korean Application No. 10-2003-0095410, Jul. 18, 2005.

Primary Examiner—B. William Baumeister
Assistant Examiner—Igwe U. Anya
(74) Attorney, Agent, or Firm—Myers Bigel Sibley & Sajovec (57) ABSTRACT

A method of forming a cobalt disilicide layer and a method of manufacturing a semiconductor device using the same are provided. The method of forming a cobalt disilicide layer includes forming a cobalt layer on at least a silicon surface of a semiconductor device using metal organic chemical vapor deposition by supplying a cobalt precursor having a formula $Co_2(CO)_6(R_1\text{---}C\!\equiv\!C\text{---}R_2)$, where $R_1$ is H or $CH_3$, and $R_2$ is hydrogen, t-butyl, phenyl, methyl, or ethyl, as a source gas. Then, a capping layer is formed on the cobalt layer. A first thermal treatment is then performed on the semiconductor device in an ultra high vacuum, for example, under a pressure of $10^{-9}$-$10^{-3}$ torr, to react silicon with cobalt. Cobalt unreacted during the first thermal treatment and the capping layer are then removed and a second thermal treatment is performed on the semiconductor device to form the cobalt disilicide ($CoSi_2$) layer.

34 Claims, 5 Drawing Sheets

U.S. PATENT DOCUMENTS

| | | | |
|---|---|---|---|
| 6,346,477 B1* | 2/2002 | Kaloyeros et al. | 438/680 |
| 6,365,516 B1* | 4/2002 | Frenkel et al. | 438/682 |
| 6,461,951 B1* | 10/2002 | Besser et al. | 438/592 |
| 6,753,245 B2* | 6/2004 | Choi | 438/613 |
| 6,777,565 B2* | 8/2004 | Choi | 556/9 |
| 7,012,024 B2* | 3/2006 | Abbott | 438/682 |
| 7,172,967 B2* | 2/2007 | Kim et al. | 438/682 |
| 2002/0061639 A1* | 5/2002 | Itonaga | 438/592 |
| 2002/0076837 A1* | 6/2002 | Hujanen et al. | 438/3 |
| 2003/0022487 A1* | 1/2003 | Yoon et al. | 438/642 |
| 2003/0124843 A1* | 7/2003 | Hashimoto | 438/682 |
| 2004/0203233 A1* | 10/2004 | Kang et al. | 438/686 |
| 2005/0014365 A1* | 1/2005 | Moon et al. | 438/680 |

\* cited by examiner

METHOD OF FORMING COBALT DISILICIDE LAYER AND METHOD OF MANUFACTURING SEMICONDUCTOR DEVICE USING THE SAME

RELATED APPLICATION

This application claims priority from Korean Patent Application No. 2003-95410, filed on Dec. 23, 2003 in the Korean Intellectual Property Office, the disclosure of which is incorporated herein by reference in its entirety.

FIELD OF THE INVENTION

The present invention relates to a method of manufacturing a semiconductor device and, more particularly, to a method of forming a cobalt disilicide layer and a method of manufacturing a semiconductor device using the same.

DESCRIPTION OF THE RELATED ART

There is an increasing demand for semiconductor devices operating at high speed and having low power consumption together with a demand for an increase in integration of semiconductor devices. To increase the integration, integrated circuit patterns must be scaled down. For example, the width of a gate electrode, the junction depth of source/drain regions, and the cross-sectional area of contacts are reduced. Such scaling down of a pattern may increase a resistance of the semiconductor device. If the resistance increases, it may become difficult to operate the semiconductor device at high speed and power consumption may increase.

To solve the above problems, a method of forming a metal silicide layer, which is a compound of metal and silicon, on a contact surface between electric conductors is widely used. Examples of metal silicide layers include a tungsten silicide layer, a titanium silicide layer, and a cobalt silicide layer. Among these metal silicide layers, the cobalt silicide layer is widely used in high performance and/or highly integrated semiconductor devices since it has low specific resistance and exhibits thermal and chemical stability.

A conventional method of forming a cobalt silicide layer includes sequentially forming capping layers such as a cobalt layer and a titanium nitride layer on a silicon surface of a semiconductor substrate by sputtering, which is a physical vapor deposition (PVD) process, and then thermally treating the resulting semiconductor substrate to react cobalt with silicon. This method is advantageous in that since a target composed of cobalt is sputtered to form a cobalt layer, there are a few impurities in the deposited cobalt layer, and since the titanium nitride layer is deposited in situ, growth of an interface oxide layer on the cobalt layer is inhibited.

However, the PVD process has a disadvantage of poor step coverage. When the semiconductor device is scaled down due to an increase in the integration, the poor step coverage can degrade the electrical characteristics of the semiconductor device because when the cobalt layer is not formed with a uniform thickness, the cobalt silicide layer also has a varying thickness, resulting in deterioration of the reliability of the semiconductor device. Research is vigorously being carried out to find a method of forming a cobalt layer with a good step coverage characteristic by using, for example, a chemical vapor deposition (CVD) process or an atomic layer deposition (ALD) process.

SUMMARY OF THE INVENTION

Embodiments of the present invention provide a method of forming a cobalt disilicide layer. The method includes supplying a cobalt precursor having a formula $Co_2(CO)_6(R_1-C\equiv C-R_2)$, where $R_1$ is H or $CH_3$, and $R_2$ is hydrogen, t-butyl, phenyl, methyl, or ethyl, as a source gas. The source gas is used to form a cobalt layer on at least a silicon surface of a semiconductor substrate. A first thermal treatment is performed on the semiconductor substrate to thereby react silicon with cobalt. This first thermal treatment is performed in a vacuum. Unreacted cobalt is then removed. A second thermal treatment is then performed on the semiconductor substrate to form the cobalt disilicide ($CoSi_2$) layer from the reacted cobalt/silicon.

According to another embodiment of the present invention, a method of forming a cobalt disilicide layer includes forming a cobalt layer on at least a silicon surface of a semiconductor device using metal organic chemical vapor deposition (MOCVD), which includes supplying a cobalt precursor having a formula $Co_2(CO)_6(R_1-C\equiv C-R_2)$, where $R_1$ is H or $CH_3$, and $R_2$ is hydrogen, t-butyl, phenyl, methyl, or ethyl, as a source gas. A capping layer is also formed on the cobalt layer. A first thermal treatment is performed on the semiconductor device under a pressure of $10^{-9}$ to $10^{-3}$ torr to react silicon with cobalt and form a cobalt silicide layer. Unreacted cobalt and the capping layer are then removed. A second thermal treatment is then performed to convert the cobalt silicide layer to a cobalt disilicide ($CoSi_2$) layer.

Another embodiment of the present invention includes forming a gate electrode structure including a gate oxide layer pattern, a polysilicon layer pattern, and spacers on a silicon substrate. Source/drain regions are formed at both sides of the gate electrode structure in the silicon substrate. A cobalt precursor having a formula $Co_2(CO)_6(R_1-C\equiv C-R_2)$, where $R_1$ is H or $CH_3$, and $R_2$ is hydrogen, t-butyl, phenyl, methyl, or ethyl, is supplied as a source gas to form a cobalt layer on at least the gate electrode structure and the source/drain regions. A first thermal treatment step is performed in a vacuum to react silicon on upper surfaces of both the gate electrode structure and the source/drain regions with cobalt. Any unreacted cobalt is then removed. Thereafter, a second thermal treatment is performed on the semiconductor device to convert the cobalt silicide layer into a cobalt disilicide ($CoSi_2$) layer. This second thermal treatment is performed at a higher temperature than the first thermal treatment.

Additional methods of the invention include forming a gate electrode structure, including a gate oxide layer pattern, a polysilicon layer pattern, and spacers, on a silicon substrate. Source/drain regions are formed at both sides of the gate electrode structure in the silicon substrate. A cobalt layer is formed on at least the gate electrode structure and the source/drain regions using MOCVD. This occurs by supplying a cobalt precursor, having a formula $Co_2(CO)_6(R_1-C\equiv C-R_2)$, where $R_1$ is H or $CH_3$, and $R_2$ is hydrogen, t-butyl, phenyl, methyl, or ethyl, as a source gas. A capping layer is then formed on the cobalt layer. A first thermal treatment step is then performed in a vacuum to react silicon on upper surfaces of both the gate electrode structure and the source/drain regions with cobalt. The unreacted cobalt and the capping layer are then removed. Thereafter, a second thermal treatment step is performed to convert the cobalt silicide layer to cobalt disilicide.

According to another embodiment of the present invention, there is provided a method of manufacturing a semiconductor device. The method includes forming an interlayer insulating film on polysilicon layer patterns, which are formed on a semiconductor substrate. The interlayer insulating film is etched to form contact holes exposing the polysilicon layer patterns. A cobalt layer is formed on the surfaces of both the exposed polysilicon layer patterns and the interlayer insulating film using MOCVD. This occurs by supplying a cobalt precursor having a formula $Co_2(CO)_6$ $(R_1—C{\equiv}C—R_2)$, where $R_1$ is H or $CH_3$, and $R_2$ is hydrogen, t-butyl, phenyl, methyl, or ethyl, as a source gas. A capping layer is then formed on the cobalt layer. A first thermal treatment is performed on the resultant structure in a vacuum to react the exposed polysilicon layer patterns with cobalt. Any unreacted cobalt and the capping layer are then removed. A second thermal treatment step is then performed to convert the cobalt silicide layer into a cobalt disilicide layer.

Other details of the above embodiments will be set forth in the description and the drawings which follow.

DETAILED DESCRIPTION OF THE INVENTION

The present invention will now be described more fully with reference to the accompanying drawings in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, like reference numbers refer to like elements throughout, and the sizes of elements may be exaggerated for clarity.

Figure 1:
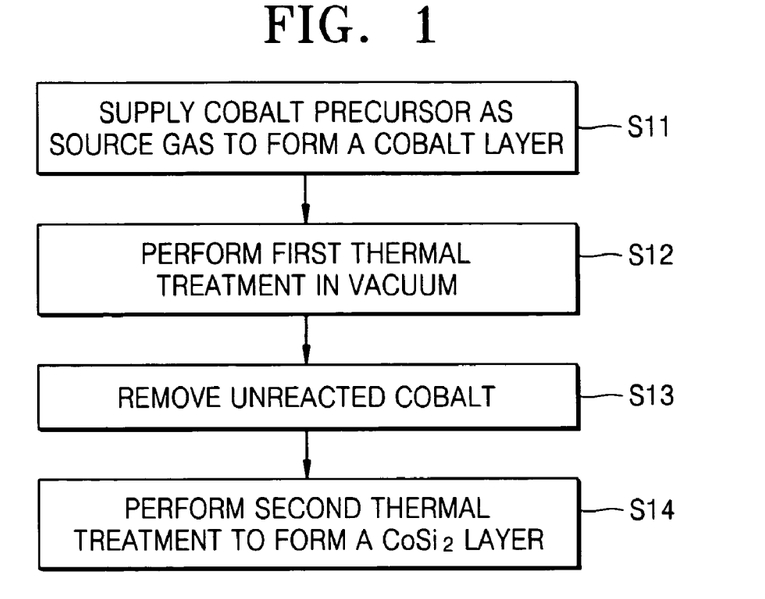
FIG. 1 is a flow chart illustrating methods of forming a cobalt silicide layer according to first embodiments of the present invention.

FIG. 1 is a flow chart illustrating a method of forming a cobalt silicide layer according to a first embodiment of the present invention. First, a semiconductor substrate is loaded in a predetermined chamber and a cobalt layer is formed on a silicon surface of the semiconductor substrate, Block S11. The thickness of the cobalt layer may be in the range of about 50-500 Å. The cobalt layer may be formed by metal organic chemical vapor deposition (MOCVD) or atomic layer deposition (ALD). MOCVD is used to form the cobalt layer in this first embodiment.

This MOCVD process will now be described in detail. A cobalt precursor for forming the cobalt layer is boiled and evaporated outside the chamber to form a gas. Materials that are in a liquid state at room temperature and are thermally stable are used as the cobalt precursor. The cobalt precursor may be a material having the formula $Co_2(CO)_6(R_1—C{\equiv}C—R_2)$, where $R_1$ is H or $CH_3$, and $R_2$ is hydrogen, t-butyl, phenyl, methyl, or ethyl. Examples of the cobalt precursor include $Co_2(CO)_6(HC{\equiv}C^tBu)$, $Co_2(CO)_6(HC{\equiv}CPh)$, $Co_2(CO)_6(HC{\equiv}CH)$, $Co_2(CO)_6(HC{\equiv}CCH_3)$, and $Co_2(CO)_6(CH_3C{\equiv}CCH_3)$. These cobalt precursors may be used alone or in a combination. Among these cobalt precursors, dicobalt hexacarbonyl t-butyl acetylene ($Co_2(CO)_6(HC{\equiv}C^tBu)$, CCTBA) is used in the first embodiment. The gaseous cobalt precursor is then supplied to the chamber in which the semiconductor substrate is loaded. Argon gas is used as a carrier gas for carrying the gaseous cobalt precursor. The gaseous cobalt precursor may be supplied at a flow rate of about 10-100 sccm. As a result, a cobalt layer is formed on an upper surface of the semiconductor substrate.

The cobalt layer deposited by MOCVD may contain impurities such as carbon and oxygen. Moreover, it is assumed that a variety of ligands contained in the cobalt precursor, which is used as a metal organic source, may incompletely react and remain in the deposited cobalt layer as additional impurities. Such impurities may be diffused into the cobalt layer during a subsequent first thermal treatment step. When this diffusion occurs, cobalt oxide and cobalt carbide can be formed in the cobalt layer. Since cobalt oxide and cobalt carbide are nonmetallic materials, they may not be readily removed during a subsequent removal of a residual cobalt layer. As a result, impurities such as cobalt oxide and/or cobalt carbide may remain in the cobalt silicide layer after a second thermal treatment.

One method of removing impurities remaining in the cobalt silicide layer is a hydrogen plasma treatment. In order to perform the hydrogen plasma treatment, hydrogen gas is first supplied to the chamber during or after forming the cobalt layer. The hydrogen gas may be supplied at a flow rate of, for example, about 500-5000 sccm. The supplied hydrogen gas is used to plasma treat the cobalt layer, which is being formed or has already been formed. The hydrogen plasma treatment is performed in order to remove the impurities from the cobalt layer by reacting hydrogen with the impurities such as carbon or oxygen contained in the cobalt layer. However, because the impurities typically cannot be completely removed by hydrogen plasma treatment, hydrogen plasma treatment is an optional process.

Another method of removing impurities remaining in the cobalt silicide layer includes performing the first thermal treatment in an ultra high vacuum (UHV), Block S12. The term "ultra high vacuum" as used herein refers to a pressure of lower than several torr, and preferably between $10^{-9}$ and $10^{-3}$ torr. Under a pressure of about $10^{-3}$ torr, nitrogen, argon, or helium may be used as an atmospheric gas. Meanwhile, under a pressure of about $10^{-6}$ torr or lower, the atmospheric gas need not be used.

To produce a UHV state, the chamber is continuously outgased during the thermal treatment process. In the surrounding condition of the UHV state, the impurities such as oxygen or carbon, which are activated due to the thermal treatment, are diffused out of the cobalt layer, thereby removing the impurities from the cobalt layer. When a natural oxide layer is formed on the surface of the cobalt layer, the natural oxide layer may also be removed during the outgas process.

The first thermal treatment may be performed in a furnace or by a rapid thermal process (RTP). The RTP is performed in the first embodiment. The first thermal treatment is performed at a temperature of, for example, 300-600° C. During the first thermal treatment, cobalt (in the cobalt layer) and silicon (in the underlying substrate) react with each other to generate a CoSi layer. Subsequently, a portion of the cobalt layer, which is not converted into a CoSi layer, is removed, Block S13. This removal may be performed using a wet etch process. For example, sulfuric acid, acetic acid, or nitric acid may be used as a wet etchant. The wet etch process may be performed for about 10-100 minutes.

Then, the second thermal treatment is performed on the semiconductor substrate to form a $CoSi_2$ layer, Block S14. The second thermal treatment is performed in order to form a $CoSi_2$ layer from the CoSi layer. The second thermal treatment can be performed at a temperature of about 700-1000° C. It is typically unnecessary to perform the second thermal treatment in a UHV as in the first thermal treatment. For example, the second thermal treatment may be performed under a pressure of about 740 torr, or in a UHV as in the first thermal treatment.

Figure 2:
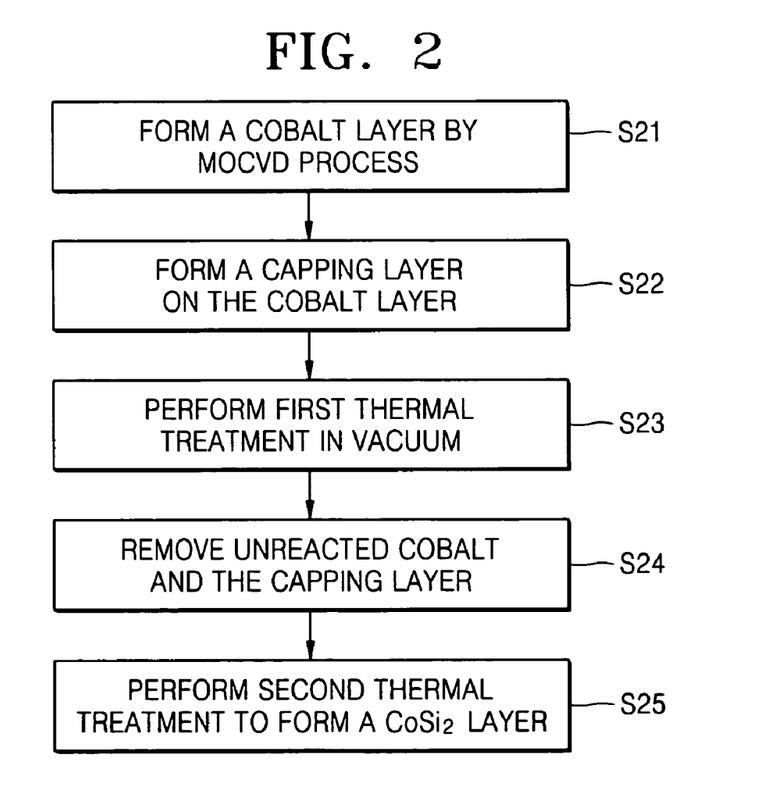
FIG. 2 is a flow chart illustrating methods of forming a cobalt silicide layer according to second embodiments of the present invention.

FIG. 2 is a flow chart that illustrates a method of forming a cobalt silicide layer according to a second embodiment of the present invention. As illustrated by Block S21, a semiconductor substrate is loaded in a predetermined chamber and a cobalt layer is formed on a silicon surface of the semiconductor substrate. To form the cobalt layer, a MOCVD process is performed. Since the formation of the cobalt layer has been described in the first embodiment, a detailed description thereof will be omitted here. Also, the plasma treatment process may be further performed during or after forming the cobalt layer is formed. Next, a capping layer is formed on the cobalt layer, Block S22. The capping layer prevents an impurity, such as a natural oxide layer, from forming on the surface of the cobalt layer when the semiconductor substrate is exposed to the atmosphere. The capping layer may be a titanium layer, a titanium nitride layer, or a compound layer including a titanium layer and a titanium nitride layer. In the second embodiment, the capping layer is a titanium layer. If the titanium nitride layer is formed on the titanium layer, the titanium nitride layer may inhibit outgas of an impurity during a subsequent first thermal treatment. As a result, the cobalt layer and the titanium layer may be converted to a nonconductive material layer by the impurity, which also may not be removed during a subsequent stripping process. In particular, due to the nonconductive material layer remaining on the cobalt layer, the resistance of the cobalt silicide layer may be increased. Moreover, the titanium-capping layer prevents oxidation of the cobalt layer and reduces formation of a cobalt oxide layer, which may be formed on the cobalt layer during the subsequent first thermal treatment.

The titanium-capping layer can be formed by physical vapor deposition, but may also be formed by chemical vapor deposition or atomic layer deposition. The thickness of the titanium layer is in the range of about 10-300 Å, and preferably may be about 50-300 Å. Since the physical vapor deposition is usually performed in a vacuum state, the pressure within the processing chamber can be about $10^{-6}$-$10^{-3}$ torr. Therefore, when depositing the capping layer by physical vapor deposition, a natural oxidation of the cobalt layer does not occur during the formation of the capping layer. However, since the respective processes of forming the cobalt layer and the capping layer are different from each other, the vacuum break may occur between the processes, thereby generating the natural oxide layer on the cobalt layer.

Subsequently, a first thermal treatment is performed to facilitate a reaction between cobalt and silicon, Block S23. To remove the natural oxide layer and/or impurities that may be remaining in the cobalt silicide layer, the first thermal treatment may be performed in a UHV. Through the first thermal treatment, impurities such as oxygen or carbon contained in the cobalt layer are diffused out of the cobalt layer and the natural oxide layer is removed. Since other specific conditions of the first thermal treatment are the same as those in the first embodiment, detailed descriptions thereof will be omitted here.

As illustrated by Block S24, a portion of the cobalt layer, which has not been converted into a CoSi layer and the capping layer, are removed. The cobalt layer and the capping layer may be removed by a wet etch process similar to the first embodiment. Then, as illustrated by Block S25, a second thermal treatment is performed on the semiconductor substrate to form a $CoSi_2$ layer. Specific processing conditions of the second thermal treatment are the same as those in the first embodiment.

FIGS. 3A through 3E are cross-sectional views illustrating a method of manufacturing a semiconductor device according to a third embodiment of the present invention. Only the differences between the present embodiment and the previous embodiments will be explained in detail. Thus, details of respective processes of the first and second embodiments, which are not described in the present embodiment, may be applied to the present embodiment.

Figure 3A:
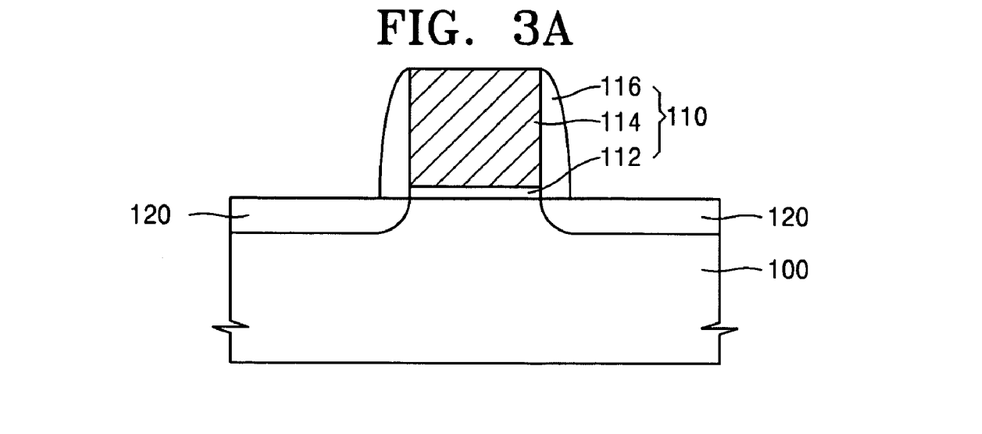
FIGS. 3A through 3E are cross-sectional views illustrating a method of manufacturing a semiconductor device according to a third embodiment of the present invention.

Referring to FIG. 3A, a silicon substrate 100 is provided. An active region and a device isolation region (not shown) are formed in the silicon substrate 100 by performing a conventional device isolation process. The device isolation region may be, for example, formed by a shallow trench isolation (STI) process. Subsequently, a transistor including a gate electrode structure 110 and source/drain regions 120 is formed on the silicon substrate 100. A conventional method may be used to form the transistor. The gate electrode structure 110 can include a gate oxide layer pattern 112, a polysilicon layer pattern 114 laminated on the gate oxide layer pattern 112, and spacers 116 formed on sidewalls of the gate oxide layer pattern 112 and the polysilicon layer pattern 114. If necessary, the gate electrode structure 110 may further include a hard mask layer pattern (not shown) on the polysilicon layer pattern 114. Meanwhile, the source/drain regions 120 are formed in the silicon substrate 100. The source/drain regions 120 may include lightly doped source and drain region extensions (not shown).

Figure 3B:
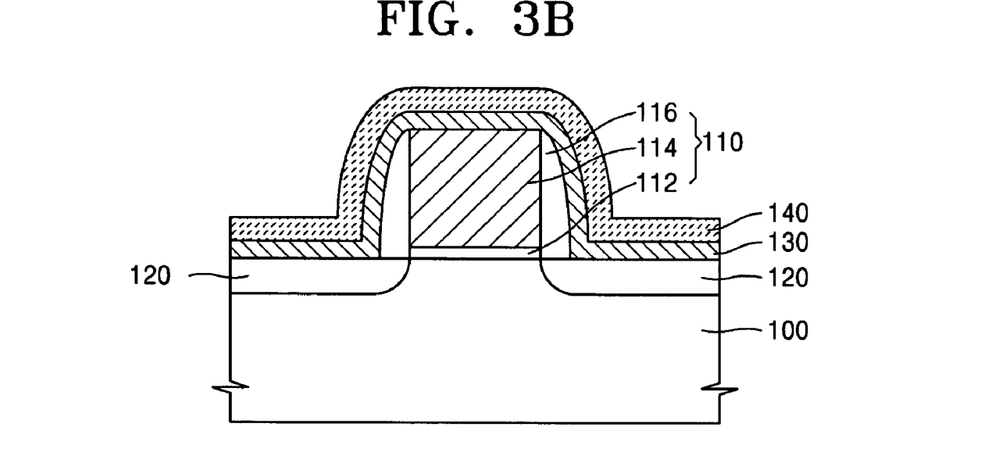

Referring to FIG. 3B, a cobalt layer 130 is formed on the resulting transistor. The cobalt layer 130 is formed on at least the source/drain regions 120 and the polysilicon layer pattern 114. The thickness of the cobalt layer 130 may be in the range of about 100-200 Å. The cobalt layer 130 may be formed by MOCVD or ALD using a cobalt precursor having the formula $Co_2(CO)_6(R_1—C≡C—R_2)$, where $R_1$ is H or $CH_3$, and $R_2$ is hydrogen, t-butyl, phenyl, methyl, or ethyl. MOCVD is used in the third embodiment. A hydrogen plasma treatment may be performed on the semiconductor substrate 100 during or after forming the cobalt layer 130.

Dicobalt hexacarbonyl t-butyl acetylene (CCTBA) may be used as the cobalt precursor. To form the cobalt layer 130, CCTBA is first boiled and evaporated outside a MOCVD chamber. Then, the evaporated CCTBA is supplied into the MOCVD chamber, in which the silicon substrate 100 is loaded. At this time, argon gas is provided as a carrier gas. The bonds of carbon and oxygen with cobalt in the evaporated CCTBA supplied to the MOCVD chamber are broken and thus the cobalt layer is deposited on the entire surface of the substrate 100. As a result of the MOCVD process, impurities such as oxygen and carbon may be contained in the deposited cobalt layer 130 and a natural oxide layer may be formed thereon.

The thickness of the cobalt layer to be formed is determined considering the thickness of the underlying (or polysilicon) silicon to be consumed during a subsequent thermal treatment. Specifically, the depth of the source/drain regions 120 formed in the silicon substrate 100 is considered, and the thickness of the cobalt layer should be determined such that a cobalt silicide layer to be formed by a subsequent thermal treatment does not completely consume the source/drain regions.

A capping layer 140 is then formed on the cobalt layer 130. The formation of the capping layer 140 is optional. For example, when the formation of the cobalt layer 130 and subsequent first thermal treatment are performed in a vacuum state and impurities such as a natural oxide layer are not present on the cobalt layer 130, the formation of the capping layer 140 may be omitted. The capping layer 140 may be a titanium layer or a titanium nitride layer, or a compound layer including a titanium layer and a titanium nitride layer. A titanium layer is used in the third embodiment. The thickness of the titanium layer 140 may be, for example, about 50-300 Å.

Figure 3C:
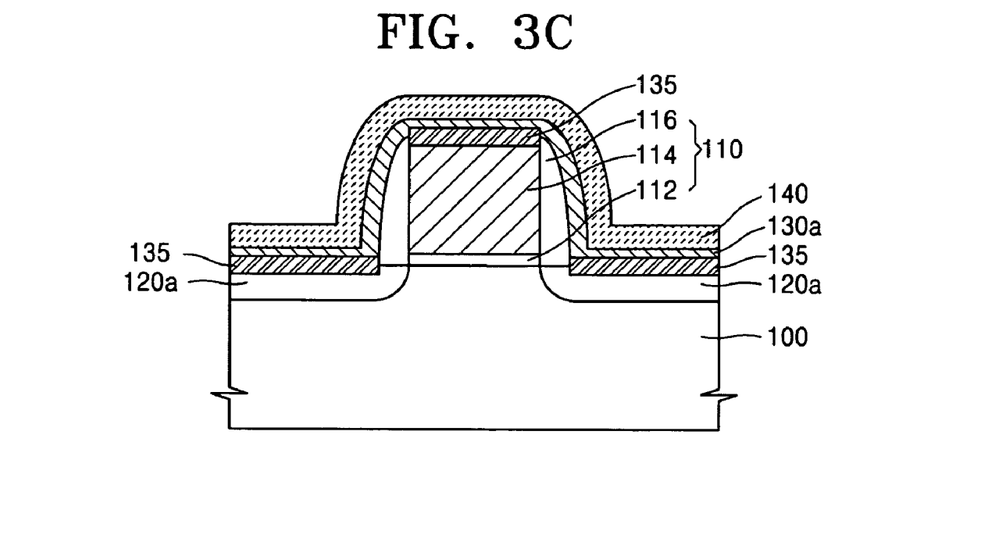

Referring to FIG. 3C, a first thermal treatment is performed on the resultant structure in a UHV state. The UHV state refers to, as described above, a pressure of lower than several torr, and may be about $10^{-9}$-$10^{-3}$ torr. The first thermal treatment is carried out at a temperature of about 300-600° C., and more preferably at a temperature of about 400-500° C., for about 90 seconds. The first thermal treatment may be carried out in a furnace or by an RTP process. The RTP process is used in the third embodiment.

It is known that the temperature at which cobalt and silicon react with each other to form $Co_2Si$ or $CoSi$ is about 400-450° C. Further, it is known that the temperature for a phase transition to $CoSi_2$ is about 600° C. or higher. Thus, when the thermal treatment is carried out at the above-described temperature, cobalt and silicon react with each other to form a $Co_2Si$ layer or a $CoSi$ layer 135.

Figure 3D:
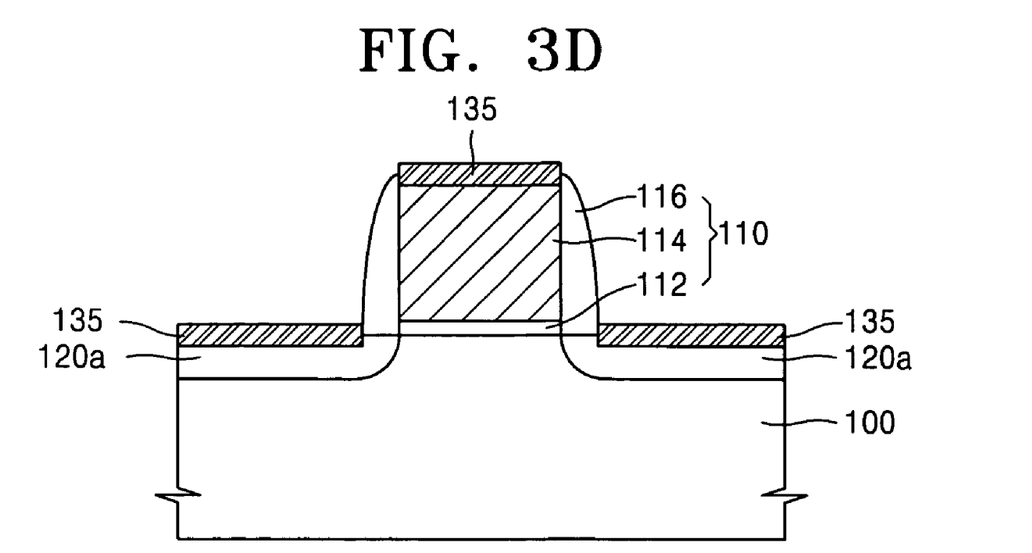

Referring to FIG. 3D, the capping layer 140 and an unreacted cobalt layer 130a are stripped away. The stripping may be carried out by wet etching using a metal etchant such as sulfuric acid, as described above. As a result, the CoSi layer 135 and the spacers 116 of the gate electrode structure are exposed.

Figure 3E:
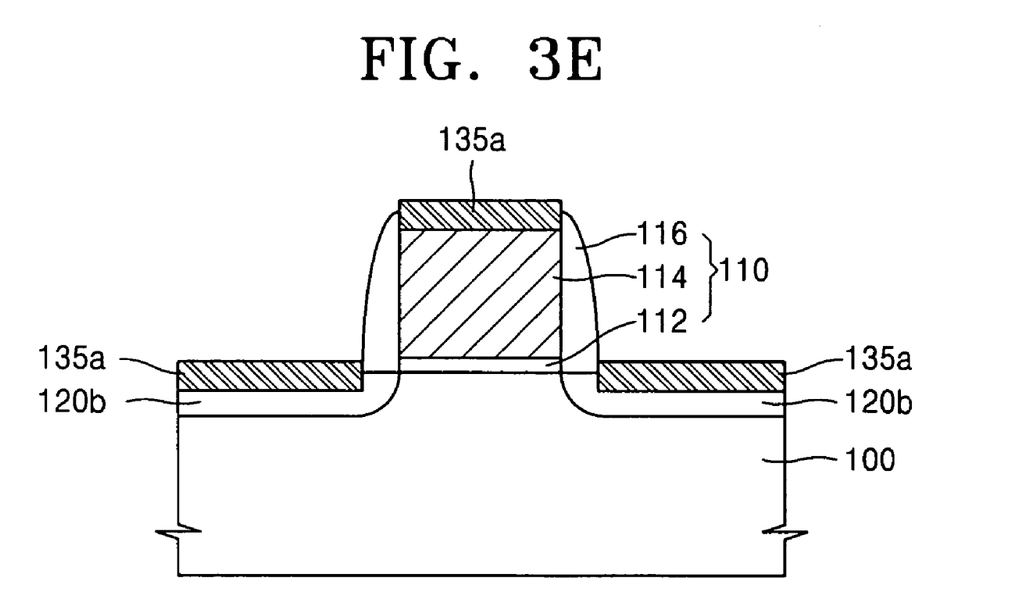

Referring to FIG. 3E, a second thermal treatment is performed on the resultant structure to form a $CoSi_2$ layer 135a. The second thermal treatment is performed at a temperature of about 600-900° C., and more preferably at a temperature of about 800-900° C., for about 30 seconds. During the second thermal treatment, the CoSi layer 135 and the silicon of the source/drain regions 120a (or polysilicon in the polysilicon layer pattern 114) react with each other to cause a phase transition to form the $CoSi_2$ layer 135a. At this time, all of the silicon in the source/drain regions 120b should not be consumed by the formation of the $CoSi_2$ layer 135a. In other words, part of the source/drain regions 120b should remain under the $CoSi_2$ layer 135a as shown in FIG. 3E. As a result, the cobalt silicide ($CoSi_2$) layer 135a is formed on the upper surfaces of both the gate electrode structure 110 and the source/drain regions 120b. Thereafter, a conventional process of manufacturing a semiconductor device is performed to complete the semiconductor device.

FIGS. 4A through 4D are cross-sectional views illustrating a method of manufacturing the semiconductor device according to a fourth embodiment of the present invention. Only the differences between the present embodiment and previous embodiments will be described in detail. Thus, details of respective processes of the first and second embodiments, which are not described in the present embodiment, may be applied to the present embodiment.

Figure 4A:
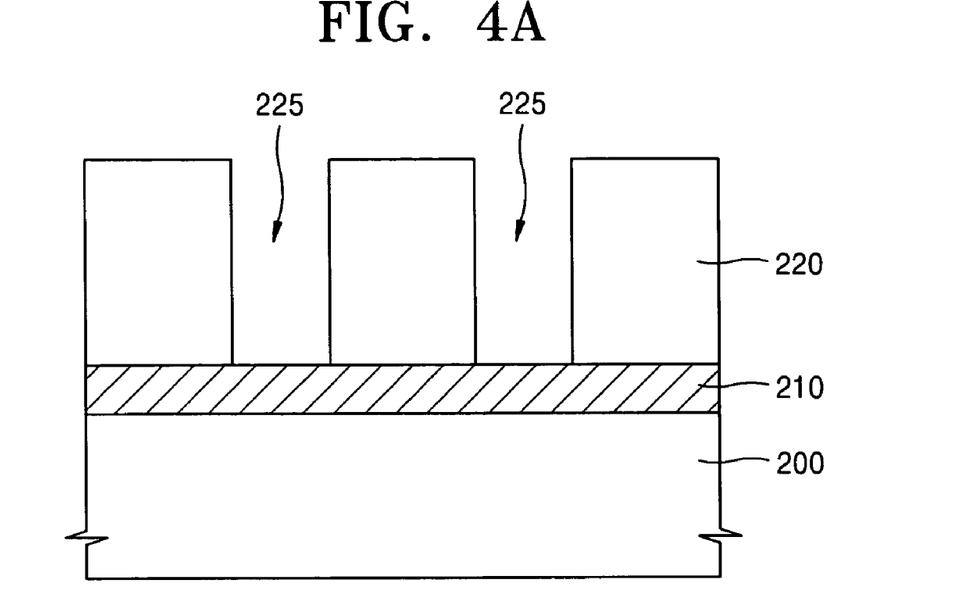
FIGS. 4A through 4D are cross-sectional views illustrating a method of manufacturing a semiconductor device according to a fourth embodiment of the present invention.

Referring to FIG. 4A, a semiconductor substrate 200 is prepared and a polysilicon layer or polysilicon layer pattern 210 is formed on the semiconductor substrate 200. When the polysilicon layer or polysilicon layer pattern 210 is not formed, the surface of the portions of the silicon substrate 200 may be exposed. Then, an interlayer insulating film 220 is formed on the polysilicon layer 210 and patterned using a conventional process of manufacturing a semiconductor device to form contact holes 225. The interlayer insulating film 220 may be a silicon dioxide layer. Part of the polysilicon layer or polysilicon layer pattern 210 is exposed by the contact holes 225.

Figure 4B:
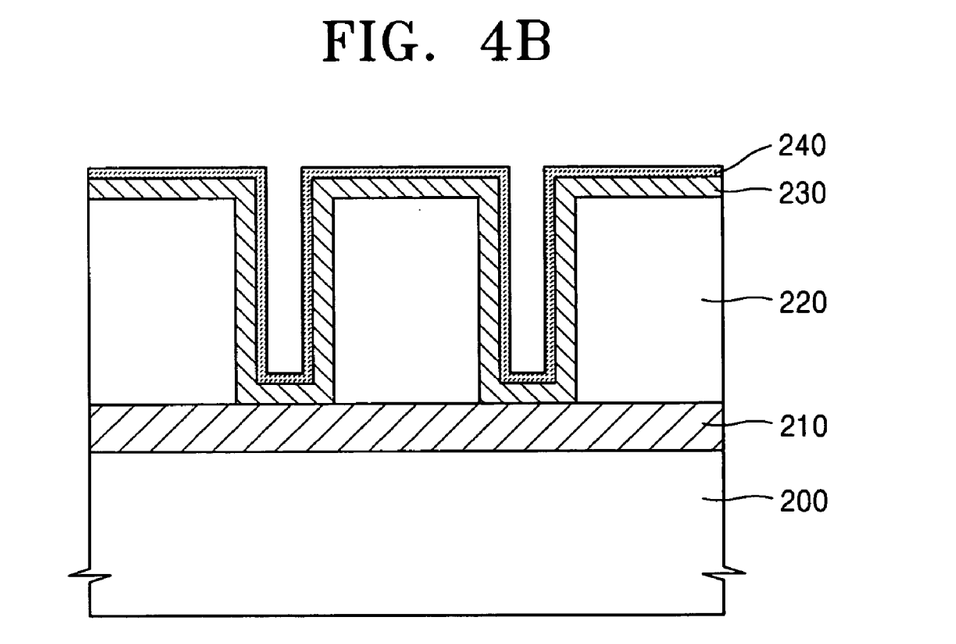

Referring to FIG. 4B, a cobalt layer 230 is formed on at least the exposed polysilicon layer 210. The cobalt layer 230 may be formed on the bottom surface and sidewalls of the contact hole 225 and on the interlayer insulating film 220 as shown in FIG. 4B. The cobalt layer 230 may be formed by, for example, MOCVD, as described in previous embodiments. Then, a titanium layer 240 is formed on the cobalt layer 230 as a capping layer.

Figure 4C:
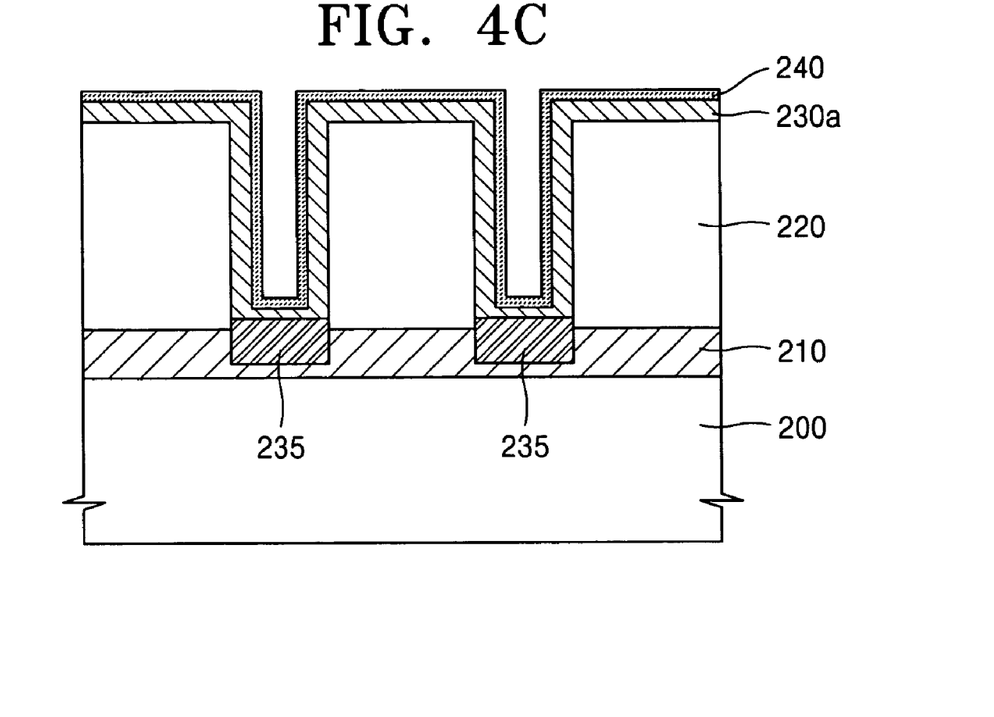

Referring to FIG. 4C, a first thermal treatment is performed on the resultant structure. The first thermal treatment is performed in a UHV as described above and at a temperature of about 400-500° C. As a result of the first thermal treatment, a $Co_2Si$ (or CoSi) layer 235 is formed on the bottom surface of the contact hole 225.

Figure 4D:
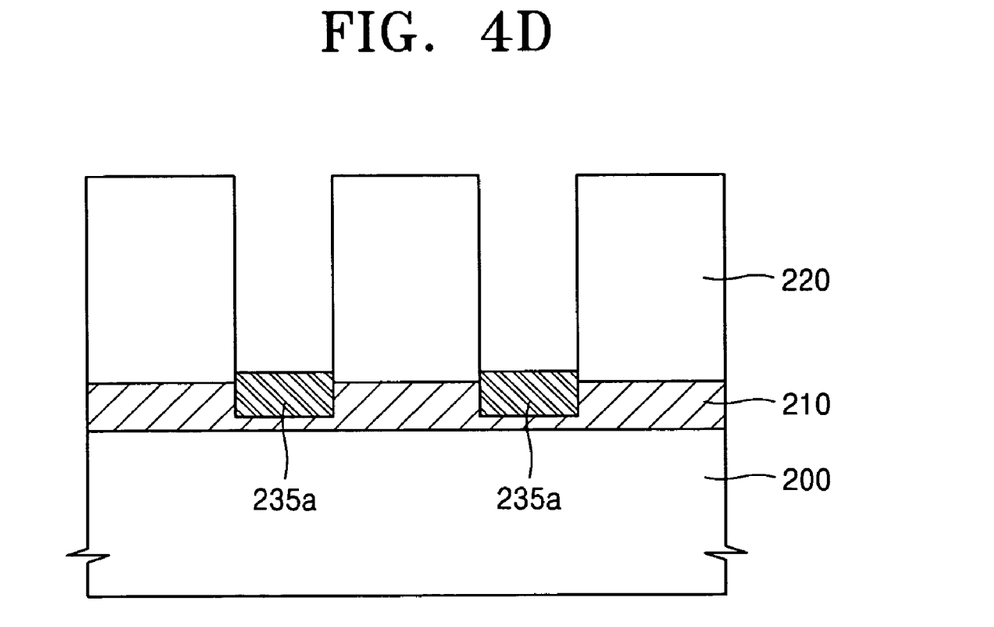

Referring to FIG. 4D, the titanium layer 240 and an unreacted portion of the cobalt layer 230a are removed by performing a strip process through wet etching. Subsequently, a second thermal treatment is performed on the resultant structure at a temperature of about 800-900° C. During the second thermal treatment, a transition of a $Co_2Si$ (or CoSi) layer 235 into a $CoSi_2$ layer 235a occurs. Subsequently, the contact holes are filled with a conductive material using a conventional process of manufacturing a semiconductor to complete the contact.

According to embodiments of the present invention, since MOCVD or atomic layer deposition is used, the step coverage of the deposited cobalt layer is high, so that a cobalt silicide layer having uniform thickness can be formed, thereby manufacturing a semiconductor device having reliable electric characteristics. In addition, although impurities may be contained in the cobalt layer when using MOCVD or a natural oxide layer may be formed by vacuum break after forming the cobalt layer, thermal treatment is performed in an ultra high vacuum to prevent the impurities or the natural oxide layer from remaining in the cobalt silicide layer, thereby avoiding an increase in resistance of the cobalt silicide layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a cobalt disilicide layer, comprising the steps of:

forming a cobalt metal layer that contacts a surface of a silicon region, by exposing the surface to a source gas comprising $Co_2(CO)_6(R_1-C\equiv C-R_2)$, where $R_1$ is H or $CH_3$, and $R_2$ is hydrogen, t-butyl, phenyl, methyl or ethyl;

converting at least a first portion of the cobalt metal layer into a cobalt silicide layer by thermally treating the cobalt metal layer at a temperature in a range between about 300° C. and about 600° C. while simultaneously exposing the cobalt metal layer to an ultra high vacuum having a pressure in a range between about $10^{-9}$ torr and about $10^{-3}$ torr;

removing at least a second portion of the cobalt metal layer to expose the cobalt silicide layer; and converting a first portion of the cobalt silicide layer into a cobalt disilicide layer by thermally treating the first portion of the cobalt silicide layer at a temperature in a range between about 600° C. and about 900° C.

2. The method of claim 1, wherein said removing step comprises exposing a portion of the cobalt metal layer to a wet etchant.

3. A method of forming a cobalt suicide layer, the method comprising:

supplying a cobalt precursor having a formula $Co_2(CO)_6$ $(R_1-C{\equiv}C-R_2)$, where $R_1$ is H or $CH_3$, and $R_2$ is hydrogen, t-butyl, phenyl, methyl, or ethyl, as a source gas to form a cobalt layer on at least a silicon surface of a semiconductor device;

performing a first thermal treatment on the semiconductor device in a vacuum to react silicon with cobalt;

removing cobalt unreacted during the first thermal treatment; and performing a second thermal treatment on the semiconductor device to form the cobalt silicide ($CoSi_2$) layer;

wherein the first thermal treatment is performed under a pressure of $10^{-9}$-$10^{-9}$ torr.

4. The method of claim 3, wherein the first thermal treatment is performed using a rapid thermal process (RTP).

5. The method of claim 3, wherein the first thermal treatment is performed using argon, nitrogen, or helium as atmospheric gas, or is performed in an ultra high vacuum.

6. The method of claim 3, wherein the first thermal treatment is performed at a temperature of 300-600° C.

7. The method of claim 3, wherein the cobalt precursor is $Co_2(CO)_6(HC{\equiv}C^tBu)$, $Co_2(CO)_6(HC{\equiv}CPh)$, $Co_2(CO)_6$ $(HC{\equiv}CH)$, $Co_2(CO)_6(HC{\equiv}CCH_3)$, or $Co_2(CO)_6$ $(CH_3C{\equiv}CCH_3)$.

8. The method of claim 3, wherein the cobalt layer is formed using a metal organic chemical vapor deposition method.

9. The method of claim 3, further comprising forming a capping layer on the cobalt layer after the forming of the cobalt layer, wherein, when removing the cobalt layer, the capping layer is also removed.

10. The method of claim 9, wherein the capping layer is a titanium layer, a titanium nitride layer, or a compound layer including a titanium layer and a titanium nitride layer.

11. A method of forming a cobalt silicide layer, the method comprising:

forming a cobalt layer on at least a silicon surface of a semiconductor device using metal organic chemical vapor deposition by supplying a cobalt precursor having a formula $Co_2(CO)_6(R_1-C{\equiv}C-R_2)$, where $R_1$ is H or $CH_3$, and $R_2$ is hydrogen, t-butyl, phenyl, methyl, or ethyl, as a source gas;

forming a capping layer on the cobalt layer;

performing a first thermal treatment on the semiconductor device under a pressure of $10^{-9}$-$10^{-3}$ torr to react silicon with cobalt;

removing cobalt unreacted during the first thermal treatment and the capping layer; and performing a second thermal treatment on the semiconductor device to form the cobalt silicide ($CoSi_2$) layer.

12. The method of claim 11, wherein the first thermal treatment is performed using a rapid thermal process (RTP).

13. The method of claim 11, wherein the first thermal treatment is performed using argon, nitrogen, or helium as atmospheric gas, or is performed in a vacuum.

14. The method of claim 11, wherein the first thermal treatment is performed at a temperature of 300-600° C. and the second thermal treatment is performed at a temperature of 700-1000° C.

15. The method of claim 11, wherein the cobalt precursor is $Co_2(CO)_6(HC{\equiv}C^tBu)$, $Co_2(CO)_6(HC{\equiv}CPh)$, $Co_2(CO)_6$ $(HC{\equiv}CH)$, $Co_2(CO)_6(HC{\equiv}CCH_3)$, or $Co_2(CO)_6$ $(CH_3C{\equiv}CCH_3)$.

16. The method of claim 11, wherein the capping layer is a titanium layer, a titanium nitride layer, or a compound layer including a titanium layer and a titanium nitride layer.

17. The method of claim 11, wherein the forming of the cobalt layer comprises:

forming a pre-cobalt layer on the silicon surface of the semiconductor device using the metal organic chemical vapor deposition by supplying the cobalt precursor as a source gas; and surface treating the pre-cobalt layer under a hydrogen atmosphere to remove impurities contained in the pre-cobalt layer.

18. The method of claim 17, wherein the forming of the pre-cobalt layer and the surface treating are repeatedly performed so as to form the cobalt layer.

19. A method of manufacturing a semiconductor device including a cobalt silicide layer, the method comprising:

forming a gate electrode structure including a gate oxide layer pattern, a polysilicon layer pattern, and spacers on a silicon substrate; forming source/drain regions at both sides of the gate electrode structure in the silicon substrate;

supplying a cobalt precursor having a formula $Co_2(CO)_6$ $(R_1-C{\equiv}C-R_2)$, where $R_1$ is H or $CH_3$, and $R_2$ is hydrogen, t-butyl, phenyl, methyl, or ethyl, as a source gas to form a cobalt layer on at least the gate electrode structure and the source/drain regions;

performing a first thermal treatment on the resultant structure under a pressure of $10^{-9}$-$10^{-3}$ Torr to react silicon on upper surfaces of both the gate electrode structure and the source/drain regions with cobalt;

removing cobalt unreacted during the first thermal treatment; and performing a second thermal treatment on the semiconductor device to form the cobalt silicide ($CoSi_2$) layer.

20. The method of claim 19, wherein the first thermal treatment is performed using a rapid thermal process (RTP).

21. The method of claim 19, wherein the first thermal treatment is performed using argon, nitrogen, or helium as atmospheric gas, or is performed in an ultra high vacuum.

22. The method of claim 19, wherein the first thermal treatment is performed at a temperature of 300-600° C.

23. The method of claim 19, wherein the cobalt precursor is $Co_2(CO)_6(HC{\equiv}C^tBu)$, $Co_2(CO)_6(HC{\equiv}CPh)$, $Co_2(CO)_6$ $(HC{\equiv}CH)$, $Co_2(CO)_6(HC{\equiv}CCH_3)$, or $Co_2(CO)_6$ $(CH_3C{\equiv}CCH_3)$.

24. The method of claim 19, wherein the cobalt layer is formed using metal organic chemical vapor deposition method.

25. The method of claim 19, further comprising forming a capping layer on the cobalt layer after the forming of the cobalt layer, wherein, when removing the cobalt layer, the capping layer is also removed.

26. The method of claim 25, wherein the capping layer is a titanium layer, a titanium nitride layer, or a compound layer including a titanium layer and a titanium nitride layer.

27. A method of manufacturing a semiconductor device including a cobalt silicide layer, the method comprising:

forming a gate electrode structure including a gate oxide layer pattern, a polysilicon layer pattern, and spacers on a silicon substrate;

forming source/drain regions at both sides of the gate electrode structure in the silicon substrate;

forming a cobalt layer on at least the gate electrode structure and the source/drain regions using metal organic chemical vapor deposition by supplying a cobalt precursor having a formula $Co_2(CO)_6(R_1—C≡C—R_2)$, where $R_1$ is H or $CH_3$, and $R_2$ is hydrogen, t-butyl, phenyl, methyl, or ethyl, as a source gas, said step of forming a cobalt layer further comprising surface treating the cobalt layer under a hydrogen atmosphere to remove impurities in the cobalt layer;

forming a capping layer on the cobalt layer;

performing a first thermal treatment on the resultant structure in a vacuum to react silicon on upper surfaces of both the gate electrode structure and the source/drain regions with cobalt;

removing cobalt unreacted during the first thermal treatment and the capping layer; and performing a second thermal treatment on the semiconductor device to form the cobalt silicide ($CoSi_2$) layer.

28. The method of claim 27, wherein the first thermal treatment is performed using a rapid thermal process (RTP).

29. The method of claim 27, wherein the first thermal treatment is performed using argon, nitrogen, or helium as atmospheric gas, or is performed in a vacuum.

30. The method of claim 27, wherein the first thermal treatment is performed at a temperature of 300-600° C. and the second thermal treatment is performed at a temperature of 700-1000° C.

31. The method of claim 27, wherein the cobalt precursor is $Co_2(CO)_6(HC≡C^tBu)$, $Co_2(CO)_6(HC≡CPh)$, $Co_2(CO)_6(HC≡CH)$, $Co_2(CO)_6(HC≡CCH_3)$, or $Co_2(CO)_6(CH_3C≡CCH_3)$.

32. The method of claim 27, wherein the capping layer is a titanium layer, a titanium nitride layer, or a compound layer including a titanium layer and a titanium nitride layer.

33. The method of claim 27, wherein said step of forming a cobalt layer comprises repeatedly performing the chemical vapor deposition of cobalt and surface treating in an alternating sequence.

34. A method of manufacturing a semiconductor device including a cobalt suicide layer, the method comprising:

forming an interlayer insulating film on a silicon substrate or a semiconductor substrate which has exposed polysilicon layer patterns thereon;

patterning the interlayer insulating film to form contact holes exposing the silicon substrate or the polysilicon layer patterns;

forming a cobalt layer on surfaces of both the exposed silicon substrate or polysilicon layer patterns and the interlayer insulating film using metal organic chemical vapor deposition by supplying a cobalt precursor having a formula $Co_2(CO)_6(R_1—C≡C—R_2)$, where $R_1$ is H or $CH_3$, and $R_2$ is hydrogen, t-butyl, phenyl, methyl, or ethyl, as a source gas;

forming a capping layer on the cobalt layer;

performing a first thermal treatment on the resultant structure in a vacuum to react the exposed silicon substrate or polysilicon layer patterns with cobalt;

removing cobalt unreacted during the first thermal treatment and the capping layer; and performing a second thermal treatment on the resultant structure to form the cobalt silicide ($CoSi_2$) layer.

* * * * *

UNITED STATES PATENT AND TRADEMARK OFFICE
CERTIFICATE OF CORRECTION

PATENT NO. : 7,312,150 B2 Page 1 of 1
APPLICATION NO. : 10/936853
DATED : December 25, 2007
INVENTOR(S) : Yun et al.

It is certified that error appears in the above-identified patent and that said Letters Patent is hereby corrected as shown below:

Column 9, Claim 3, Line 13: Please correct "suicide"
To read: --silicide--

Line 27: Please correct "$10^{-9}$-$10^{-9}$"
To read: --$10^{-9}$-$10^{-3}$--

Column 12, Claim 34, Line 10: Please correct "suicide"
To read: --silicide--

Signed and Sealed this

Twenty-ninth Day of April, 2008

JON W. DUDAS
*Director of the United States Patent and Trademark Office*